(12) United States Patent
Ryu et al.

(10) Patent No.: US 7,983,251 B2
(45) Date of Patent: Jul. 19, 2011

(54) BROADCASTING SERVICE TRANSMISSION/RECEPTION METHOD AND APPARATUS FOR PROVIDING FAST ACCESS TO BROADCASTING SERVICE

(75) Inventors: Ga-hyun Ryu, Suwon-si (KR); Sung-il Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 221 days.

(21) Appl. No.: 12/122,309

(22) Filed: May 16, 2008

(65) Prior Publication Data
US 2008/0285679 A1 Nov. 20, 2008

Related U.S. Application Data

(60) Provisional application No. 60/938,477, filed on May 17, 2007.

(30) Foreign Application Priority Data

Jul. 25, 2007 (KR) .................. 10-2007-0074642

(51) Int. Cl.
*H04L 12/50* (2006.01)
(52) U.S. Cl. ...................... 370/365; 370/389
(58) Field of Classification Search .......... 370/389, 370/465, 470–476; 455/3.01; 348/426.1, 348/430.1, 467
See application file for complete search history.

(56) References Cited

U.S. PATENT DOCUMENTS

| 7,203,955 | B2* | 4/2007 | Mercier .................. 725/141 |
| 2006/0246836 | A1 | 11/2006 | Simon |
| 2007/0140307 | A1* | 6/2007 | Mercier .................. 370/535 |
| 2008/0211969 | A1* | 9/2008 | Simon et al. ............. 348/725 |
| 2008/0232453 | A1* | 9/2008 | Cohen et al. ............. 375/232 |
| 2009/0214043 | A1 | 8/2009 | Choi et al. |

FOREIGN PATENT DOCUMENTS

| EP | 1081866 A3 | 3/2001 |
| KR | 1020040007588 A | 1/2004 |
| KR | 1020050056708 A | 6/2005 |
| KR | 100692903 B1 | 3/2007 |
| KR | 10-2009-0090809 A | 8/2009 |

OTHER PUBLICATIONS

Office Action issued Apr. 4, 2011 in counterpart Canadian Application No. 2,667,571.

* cited by examiner

*Primary Examiner* — Ricky Ngo
*Assistant Examiner* — Gary Mui
(74) *Attorney, Agent, or Firm* — Sughrue Mion, PLLC

(57) ABSTRACT

Provided are a method and apparatus for providing fast access to a broadcasting service transferred. The apparatus includes a reception unit for receiving one or more transmission frame; a transmission frame processing unit for analyzing access information required to access a turbo stream for a primary service to be primarily processed from a predetermined region of each transmission frame and accessing the turbo stream for the primary service of each transmission frame by using the analyzed access information; and a turbo stream processing unit for processing the turbo stream.

26 Claims, 6 Drawing Sheets

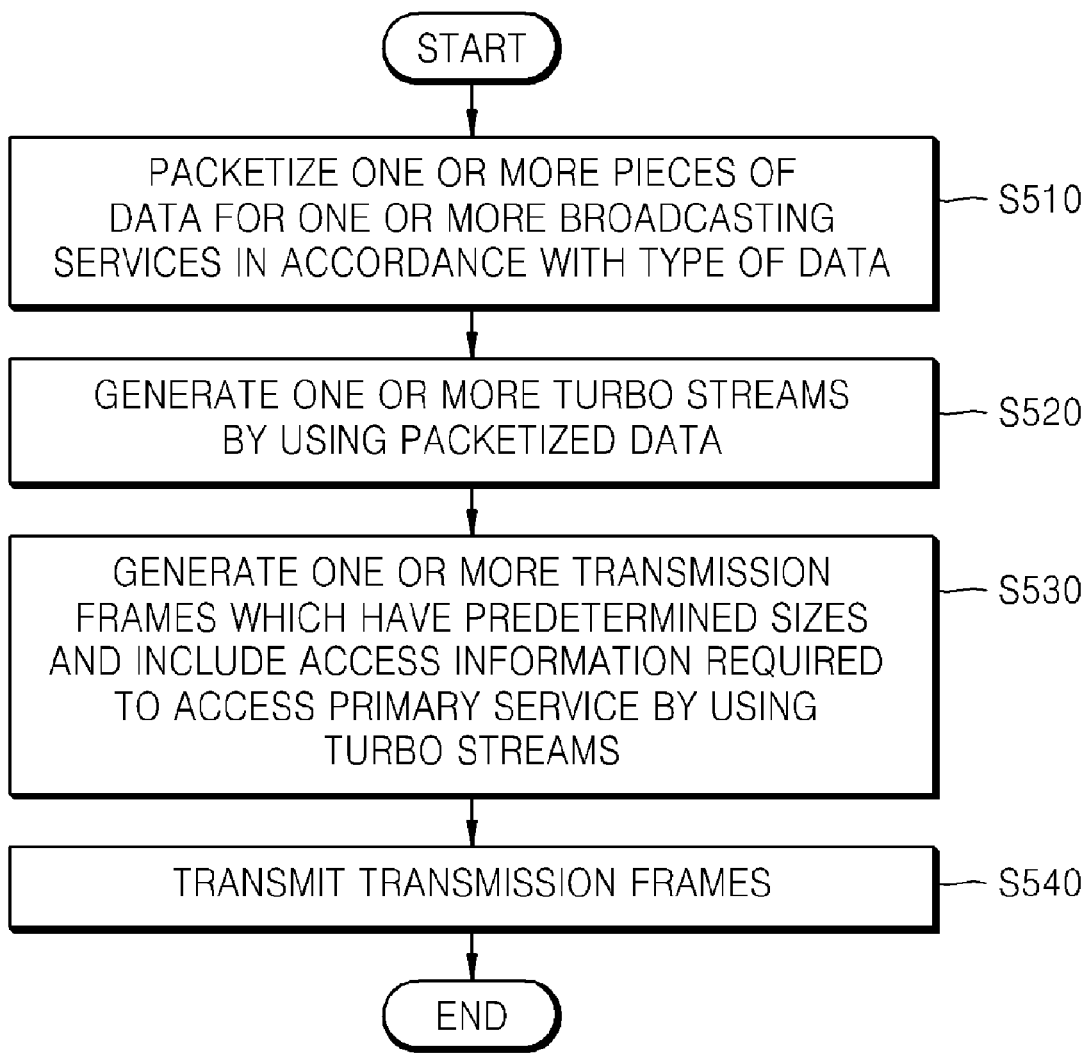

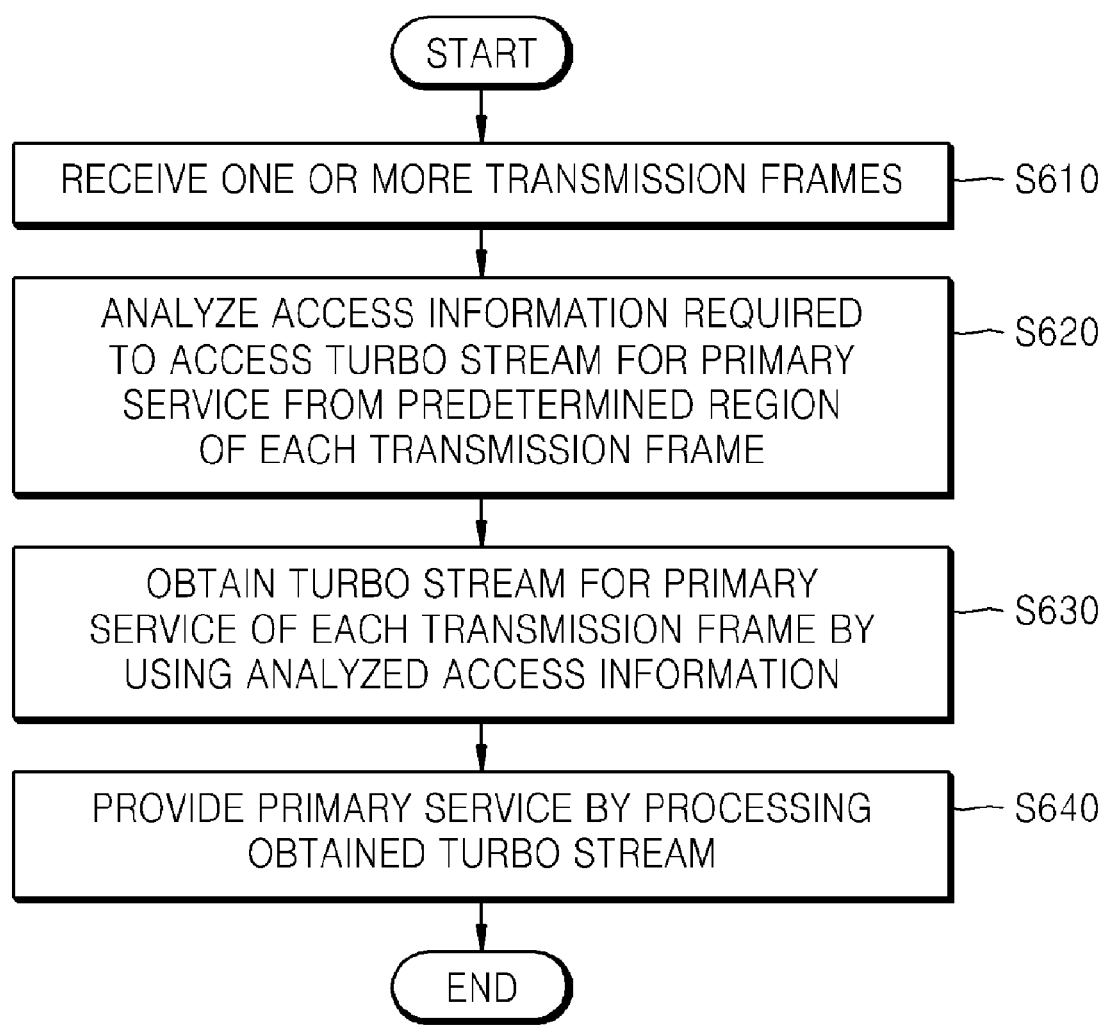

BROADCASTING SERVICE TRANSMISSION/RECEPTION METHOD AND APPARATUS FOR PROVIDING FAST ACCESS TO BROADCASTING SERVICE

CROSS-REFERENCE TO RELATED PATENT APPLICATIONS

This application claims priority from U.S. Provisional Application No. 60/938,477, filed on May 17, 2007, in the U.S. Patent and Trademark Office, and Korean Patent Application No. 10-2007-0074642, filed on Jul. 25, 2007, in the Korean Intellectual Property Office, the disclosures of which are incorporated herein in their entirety by reference.

BACKGROUND OF THE INVENTION

1. Field of the Invention

Methods and apparatuses consistent with the present invention relate to broadcasting service transmission and reception, and more particularly, to broadcasting service transmission and reception for providing fast access to a broadcasting service transferred by an Advanced Television Systems Committee (ATSC) system.

2. Description of the Related Art

The Advanced Television Systems Committee (ATSC) standards were developed for terrestrial digital televisions (DTVs) in the United States. The key elements of the ATSC standards include compression and transmission of audio and video (A/V) data. In more detail, image signals are compressed by using the Moving Picture Experts Group-2 (MPEG-2) standard, sound or speech signals are compressed by using the audio codec-3 (AC-3) standard, and the image, sound, and audio signals are transmitted by using the vestigial sideband (VSB) standard. The VSB standard for the DTV has an advantage that frequency bands can be efficiently used and has a disadvantage that a terminal cannot effectively receive radio waves while the terminal is moving. Therefore, the VSB standard cannot be applied to mobile television (TV). Meanwhile, as user terminals using the DTV increase and demands for a broadcasting service of the DTV increase and vary, various DTV broadcasting technologies are being suggested.

SUMMARY OF THE INVENTION

The present invention provides a broadcasting service transmission/reception method and apparatus for providing fast access to a broadcasting service.

According to an aspect of the present invention, there is provided a method of transmitting a broadcasting service, the method including packetizing one or more pieces of data for one or more broadcasting services in accordance with the type of the data; generating one or more turbo streams by using the packetized data; generating one or more transmission frames having predetermined sizes by using the turbo streams; and transmitting the transmission frames, and the turbo streams may include a turbo stream for a primary service to be primarily processed by a broadcasting service reception apparatus and access information required to access the turbo stream for the primary service is included in a predetermined region of a transmission frame.

The transmission frames may be Advanced Television Systems Committee (ATSC) frames, and the access information required to access the turbo stream for the primary service may be included in a data field sync (DFS) segment.

The access information may include decoding information required to decode the turbo stream for the primary service.

The turbo stream for the primary service may be transmitted through remaining data regions which remain after the turbo streams are mapped to the transmission frames.

The data may include signaling information, and the signaling information may be transmitted through remaining data regions which remain after the turbo streams are mapped to the transmission frames.

The transmission frames may include information indicating whether the signaling information or the turbo stream for the primary service is transmitted through remaining data regions which remain after the turbo streams are mapped to the transmission frames or not.

According to another aspect of the present invention, there is provided an apparatus for transmitting a broadcasting service, the apparatus including a packet generation unit for packetizing one or more pieces of data for one or more broadcasting services in accordance with the type of the data; a turbo stream generation unit for generating one or more turbo streams by using the packetized data; a transmission frame generation unit for generating one or more transmission frames having predetermined sizes by using the turbo streams; and a transmission unit for transmitting the transmission frames, and the turbo streams may include a turbo stream for a primary service to be primarily processed by a broadcasting service reception apparatus and access information required to access the turbo stream for the primary service is included in a predetermined region of a transmission frame.

According to another aspect of the present invention, there is provided a method of receiving a broadcasting service, the method including receiving one or more transmission frame; analyzing access information required to access a turbo stream for a primary service to be primarily processed from a predetermined region of each transmission frame; accessing the turbo stream for the primary service of each transmission frame by using the analyzed access information; and processing the turbo stream.

According to another aspect of the present invention, there is provided an apparatus for receiving a broadcasting service, the apparatus including a reception unit for receiving one or more transmission frame; a transmission frame processing unit for analyzing access information required to access a turbo stream for a primary service to be primarily processed from a predetermined region of each transmission frame and accessing the turbo stream for the primary service of each transmission frame by using the analyzed access information; and a turbo stream processing unit for processing the turbo stream.

BRIEF DESCRIPTION OF THE DRAWINGS

The above and other aspects of the present invention will become more apparent by describing in detail exemplary embodiments thereof with reference to the attached drawings, in which:

FIG. 5 is a flowchart of a method of transmitting a broadcasting service, according to an exemplary embodiment of the present invention; and FIG. 6 is a flowchart of a method of receiving a broadcasting service, according to an exemplary embodiment of the present invention.

DETAILED DESCRIPTION OF EXEMPLARY EMBODIMENTS

Hereinafter, the present invention will be described in detail by explaining embodiments of the invention with reference to the attached drawings.

Figure 1:
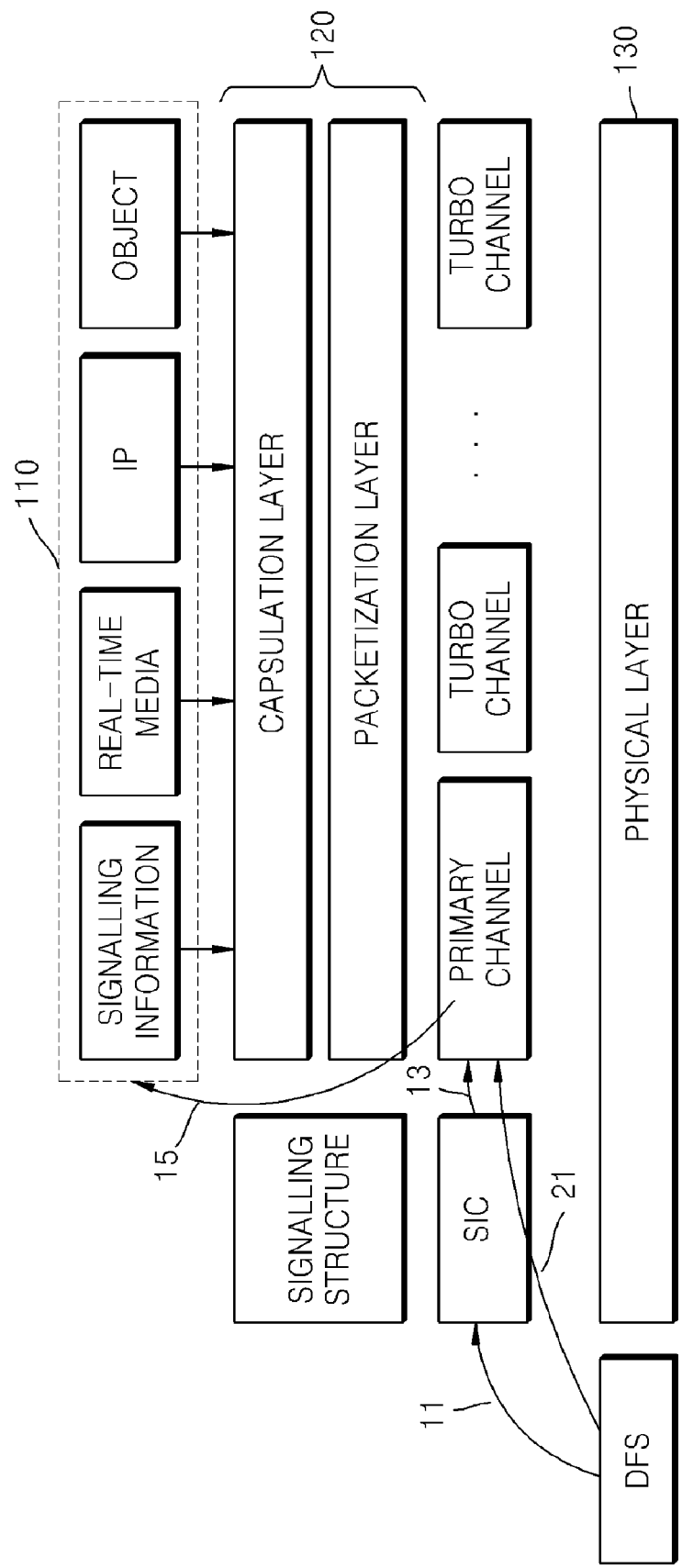
FIG. 1 is a diagram illustrating a protocol stack for a broadcasting service, according to an exemplary embodiment of the present invention.

FIG. 1 is a diagram illustrating a protocol stack for a broadcasting service, according to an exemplary embodiment of the present invention.

Referring to FIG. 1, the protocol stack includes an application layer 110, a transport layer 120 and a physical layer 130. In order to allow broadcasting channels, which transmit broadcasting services, to be efficiently used or to be suitable for mobile broadcasting, an additional layer may further be included to the protocol stack.

According to the current exemplary embodiment, the broadcasting service includes a real-time service, an Internet protocol (IP) service, and an object service. The real-time service is used when audio and video (A/V) data is intended to be received and consumed in real-time. Data used for the real-time service includes A/V data and supplementary information to be displayed together with the A/V data. The IP service is provided over a wide region, includes datacasting and other IP data received in real time, and is intended to be consumed in real-time or to be stored and consumed after a predetermined period of time. The object service includes multimedia data previously received at a predetermined point of time, and is intended to be displayed after a predetermined period of time in response to received control information. In the present invention, the broadcasting service may include at least one of the real-time service, the IP service, and the object service.

The application layer 110 includes signaling information and application data including real-time A/V data, an IP, and objects which compose the broadcasting service. The signaling information includes configuration information of one or more broadcasting services to be transmitted through transmission frames.

The transport layer 120 may also be referred to as a capsulation and packetization layer. The transport layer 120 provides application details for the application data and fragmentation information. In the transport layer 120, each piece of the application data is capsulated into a packet of elementary data having a predetermined type and certain syntax. An application stream, that is, a sequence of capsulated packets is generated. Then, one application stream is generated into packets having fixed lengths or at least one application stream is multiplexed so as to be generated into the packets having fixed lengths. In the present invention, a series of the packets having fixed lengths is referred to as a turbo packet, and a sequence of turbo packets is referred to as a turbo stream. Each turbo stream is formed into a turbo channel, is mapped to a deterministic frame structure, and is transferred to the physical layer 130. The deterministic frame structure means that a transmission frame such as an Advanced Television Systems Committee (ATSC) frame has fixed size and type.

Service description information and the signaling information of each broadcasting service are formed to a signaling structure in a packetization layer, are formed into a signaling information channel (SIC), and are transferred to the physical layer 130. In the physical layer 130, location information of the SIC is included into a data field sync (DFS) segment in the transmission frame.

In order to provide the broadcasting service having the protocol stack illustrated in FIG. 1, a broadcasting service reception apparatus has to proceed following steps.

Firstly, the DFS segment of the physical layer 130 is analyzed so as to check the location information of the SIC. Then the broadcasting service reception apparatus accesses the SIC by using the location information of the SIC as indicated by an arrow 11. The SIC includes information on the number of turbo channels composing the transmission frame and configuration information on each turbo channel such as turbo channel decoding information and meta-data.

The broadcasting service reception apparatus accesses a predetermined turbo channel by using the information included in the SIC as indicated by an arrow 13, processes a turbo stream transmitted through the turbo channel, and thus may obtain data of the application layer 110 as indicated by an arrow 15. Although the broadcasting service reception apparatus accesses a primary channel through the SIC, according to the current exemplary embodiment illustrated in FIG. 1, the broadcasting service reception apparatus may also access other turbo channels by using the SIC. The data of the application layer 110 included in the turbo stream transferred through the turbo channel is processed and thus the broadcasting service is provided.

When power is supplied to the broadcasting service reception apparatus, a predetermined period of waiting time is required for receiving broadcasting signals and providing a broadcasting service through the above-described procedure. In order to solve a problem that the broadcasting service is not provided until the SIC is completely analyzed, the broadcasting service reception apparatus defines a "primary service" so as to provide a default service without channel search of a user. The primary service is intended to be primarily viewed to the user by a broadcasting service provider.

A turbo stream for the primary service is also formed by the same procedure as the procedure performed when another normal turbo stream is formed. However, access information of the primary service is located at a predetermined region of the transmission frame. In a case of the ATSC transmission frame according to the ATSC standards, the access information of the primary service is defined by the DFS segment. Thus, according to an exemplary embodiment of the present invention, the broadcasting service reception apparatus may not search for and process the SIC and may directly access the turbo stream for the primary service from the DFS segment as indicated by an arrow 21.

Figure 2:
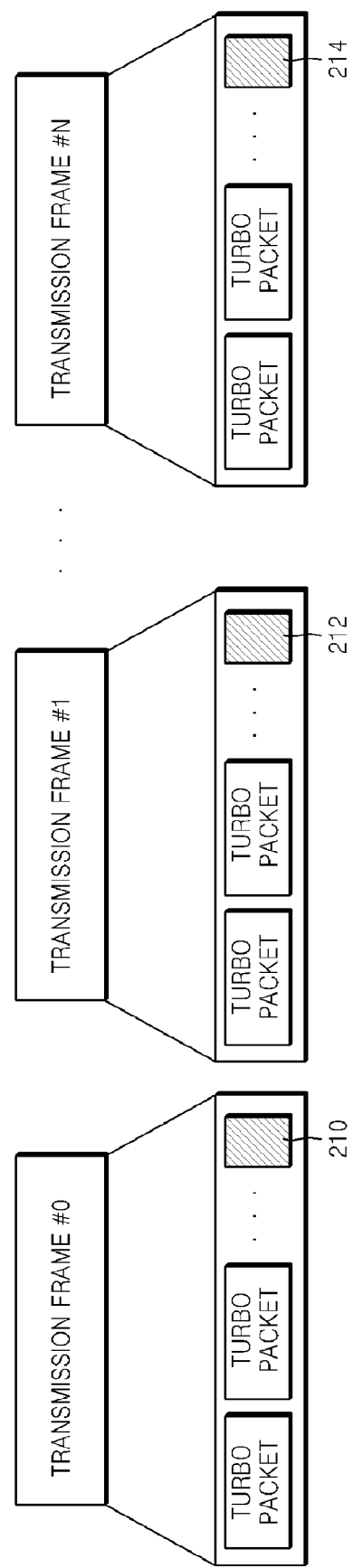
FIG. 2 is a diagram for illustrating remaining data regions which remain after a transmission stream is allocated, according to an exemplary embodiment of the present invention.

FIG. 2 is a diagram for illustrating remaining data regions 210, 212, and 214 which remain after a transmission stream is allocated, according to an exemplary embodiment of the present invention.

Transmission frames used for the present invention have a predetermined size and turbo channels used for transmitting each turbo stream transferred through the each transmission frame also have a predetermined size. In general, the size of a transmission frame is not a multiple of the size of a turbo channel so that a data region having a predetermined size continuously remains after at least one turbo channel is allocated to the transmission frame.

Referring to FIG. 2, turbo packets are allocated to each of transmission frames #0 through #n to be periodically transmitted, and data regions 210, 212, and 214, that have predetermined sizes and are not occupied by the turbo packets, remain. If signaling information or a turbo stream for a primary service is transmitted through the remaining data regions 210, 212, and 214, broadcasting channels may not be unnecessarily wasted and may be efficiently used, in comparison with a case when an SIC and a turbo stream for the primary service which have predetermined sizes are allocated to a normal data region of the transmission frame.

Signaling information or data for the primary service as well as other turbo streams may be transmitted by mapped to the transmission frame. However, according to the current exemplary embodiment, the signaling information is formed into the SIC, the data for the primary service is formed into the turbo stream for the primary service, and the SIC and the turbo stream for the primary service may be transferred through the remaining data regions 210, 212, and 214 of the transmission frames #0 through #n. Conventionally, the remaining data region of the transmission frame will be smaller than conventional sizes of a primary service turbo channel for transmitting the turbo stream for the primary service and the SIC. Accordingly, the primary service turbo channel and the SIC will be divided in accordance with the sizes of the remaining data regions 210, 212, and 214 and be transmitted through the plurality of transmission frames #0 through #n.

As described above, signaling information or data for a primary service may be transmitted through a transmission frame by using two different methods. A broadcasting service transmission apparatus may transmit first information indicating whether the signaling information is to be transmitted through a separately allocated SIC or a remaining data region of the transmission frame and second information indication whether the data for the primary service is to be transmitted through a separately allocated primary service turbo channel or the remaining data region of the transmission frame by including the first and second information in a DFS segment. A broadcasting service reception apparatus analyzes the DFS segment from the transmission frame so that the signaling information or the data for the primary service may be accessed fast by using the first and second information.

Figure 3:
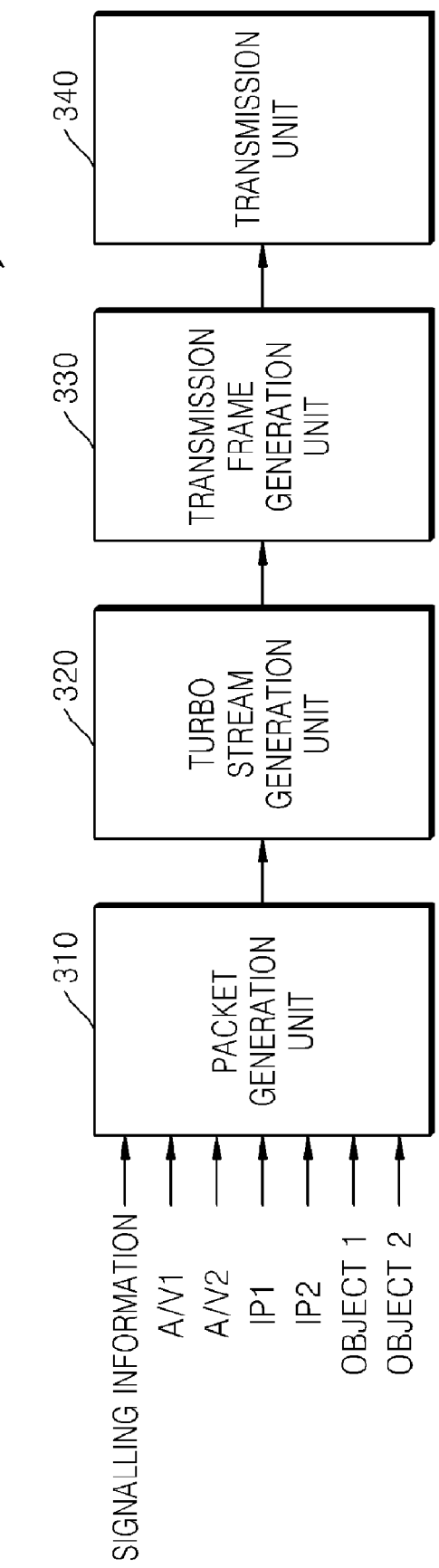
FIG. 3 is a block diagram of a broadcasting service transmission apparatus according to an exemplary embodiment of the present invention.

FIG. 3 is a block diagram of a broadcasting service transmission apparatus 300 according to an exemplary embodiment of the present invention. Referring to FIG. 3, the broadcasting service transmission apparatus 300 includes a packet generation unit 310, a turbo stream generation unit 320, a transmission frame generation unit 330, and a transmission unit 340.

The packet generation unit 310 packetizes one or more pieces of data for one or more broadcasting services in accordance with the type of the data. The data includes real-time A/V data, IP data, object data, and signaling information.

The turbo stream generation unit 320 generates the packetized data into one or more turbo streams each corresponding to a broadcasting service. At least one packetized data may be generated into a turbo stream, and at least one packetized data may be multiplexed so as to be generated into a turbo stream. For example, the turbo stream may be generated by packetizing and multiplexing A/V data A/V1, IP data IP1, and object data OBJECT 1.

The turbo streams include a turbo stream for a primary service to be primarily processed in the broadcasting service transmission apparatus 300.

The transmission frame generation unit 330 generates transmission frames having predetermined sizes by using one or more turbo streams.

Access information required to access the turbo stream for the primary service is included in predetermined regions of the transmission frames. In a case of the transmission frames of an ATSC system, the access information may be included in a DFS segment so as to be transmitted. The access information includes location information indicating the location of the primary service and decoding information required to decode a turbo stream for the primary service. However, when the primary service is transmitted through a remaining data region of a transmission frame as illustrated in FIG. 2, if a broadcasting service reception apparatus has location information of the remaining data region, the location information does not need to be transmitted.

The transmission unit 340 transmits the transmission frames. According to an exemplary embodiment of the present invention, a broadcasting service is provided by sequentially and periodically transmitting the transmission frames through a predetermined channel.

The signaling information may be transmitted through an SIC that is a channel separately allocated to transmit the signaling information by a transmission layer as in a turbo channel separately allocated to transmit normal turbo streams. Location information of the SIC may be included in a predetermined region of the transmission frame. Location information of the signaling information may also be included in the DFS segment.

Alternatively, if the transmission layer does not allocate the SIC for transmitting the signaling information, the transmission frame generation unit 330 maps at least one turbo stream to a transmission frame having a predetermined size and includes the signaling information in a remaining data region of the transmission frame.

The packet generation unit 310 determines the number of turbo channels for transmitting the turbo streams which will be allocated to the transmission frames which will be generated by the transmission frame generation unit 330, have predetermined sizes, and will be periodically transmitted. Also, the packet generation unit 310 transmits information on the sizes of remaining data regions of the transmission frames which will be remain after the turbo channels are allocated, to the transmission frame generation unit 330. Then, the transmission frame generation unit 330 may generate the transmission frames by allocating the SIC to the transmission frames based on the information transmitted from the packet generation unit 310. If the size of the SIC is larger than a remaining data region of a transmission frame, the transmission frame generation unit 330 may divide the signaling information into a plurality of pieces and may transmit the pieces of the signaling information through a plurality of transmission frames. If the primary service is transmitted through the remaining data region of a transmission frame, the transmission frame generation unit 330 may also divide the turbo stream for the primary service in accordance with the size of the remaining data region and transmit the turbo stream for the primary service through a plurality of transmission frames.

The transmission frame generation unit 330 includes information indicating whether the signaling information or the primary service is transmitted through the remaining data region of the transmission frame or not, in a predetermined region of the transmission frame so that the broadcasting service reception apparatus may process the transmission frame based on the information.

Figure 4:
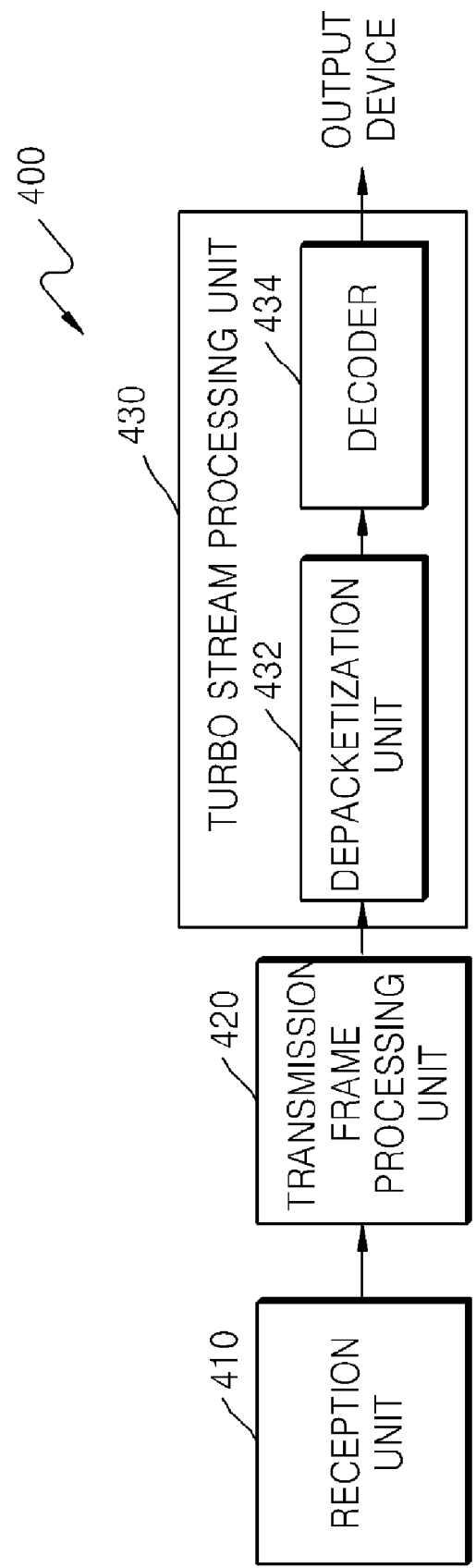
FIG. 4 is a block diagram of a broadcasting service reception apparatus according to an exemplary embodiment of the present invention.

FIG. 4 is a block diagram of a broadcasting service reception apparatus 400 according to an exemplary embodiment of the present invention. Referring to FIG. 4, the broadcasting service reception apparatus 400 includes a reception unit 410, a transmission frame processing unit 420, and a turbo stream processing unit 430.

The reception unit 410 receives one or more transmission frames. The transmission frame processing unit 420 analyzes access information required to access a turbo stream for a primary service to be primarily processed by the broadcasting service reception apparatus 400 from a predetermined region of at least one transmission frame. Then, the transmission frame processing unit 420 accesses the turbo stream for the primary service of the transmission frame by using the analyzed access information.

Transmission frames processed by the transmission frame processing unit 420 may be ATSC frames, and the transmission frame processing unit 420 may obtain the access information from a DFS segment of an ATSC frame. The access information includes information required to access decoding information that is required to decode the primary service transmitting a turbo stream for the primary service, and also includes location information, size information, and a coding rate of the turbo stream for the primary service.

The turbo stream processing unit 430 processes the turbo stream. The turbo stream processing unit 430 includes a depacketization unit 432 for obtaining data composing a broadcasting service by depacketizing the turbo stream and a decoder 434 for processing the data. The data includes at least one of real-time A/V data, IP data, object data, and signaling information. Decoded data is output to an output device.

Meanwhile, the signaling information may be transferred through an SIC separately allocated in a layer in which the turbo stream is generated. In this case, the transmission frame processing unit 420 accesses the SIC by analyzing location information of the SIC located at a predetermined region of the transmission layer. Then, the transmission frame processing unit 420 analyzes the signaling information of the SIC and transfers the analyzed signaling information to the turbo stream processing unit 430. Then, the turbo stream processing unit 430 may access the turbo stream corresponding to a broadcasting service from among one or more broadcasting services by using the transferred signaling information.

Alternatively, at least one turbo stream is mapped to a transmission frame having a predetermined size, and the signaling information may be transferred through a remaining data region of the transmission frame. In this case, the transmission frame processing unit 420 collects the signaling information transferred through the remaining data region of the transmission frame. If the signaling information is transferred through remaining data regions of a plurality of transmission frames, when a unit of the signaling information is collected from the plurality of transmission frames, any other turbo streams as well as the turbo stream for the primary service may be accessed by using the collected signaling information. According to an exemplary embodiment of the present invention, the broadcasting service reception apparatus 400 may collect the signaling information transferred through the remaining data regions while the primary service is being provided.

Furthermore, as described above, the turbo stream for the primary service may also be divided in accordance with the sizes of the remaining regions and be transmitted through a plurality of transmission frames.

The transmission frame processing unit 420 may determine a processing method of a transmission frame by using information indicating whether the signaling information or the turbo stream for the primary service which are obtained from a predetermined region of the transmission frame is transmitted through a remaining data region of the transmission frame or not. Accordingly, in accordance with the information, a normal transmission frame may be processed, and a unit of the signaling information or the turbo stream for the primary service may be obtained through a plurality of transmission frames.

FIG. 5 is a flowchart of a method of transmitting a broadcasting service, according to an exemplary embodiment of the present invention.

Referring to FIG. 5, in operation S510, one or more pieces of data for one or more broadcasting services are packetized in accordance with the type of the data.

In operation S520, one or more turbo streams are generated by using the packetized data. The turbo streams include a turbo stream for a primary service to be primarily processed by a broadcasting service reception apparatus and access information required to access the turbo stream for the primary service is included in a predetermined region of a transmission frame.

In operation S530, one or more transmission frames having predetermined sizes are generated by using the turbo streams.

In operation S540, the transmission frames are transmitted. The transmission frames may be periodically and sequentially transmitted.

FIG. 6 is a flowchart of a method of receiving a broadcasting service, according to an exemplary embodiment of the present invention.

Referring to FIG. 6, in operation S610, one or more transmission frames are received.

In operation S620, access information required to access a turbo stream for a primary service to be primarily processed by a broadcasting service reception apparatus is analyzed from a predetermined region of each transmission frame.

In operation S630, the turbo stream for the primary service of each transmission frame is obtained by using the analyzed access information.

In operation S640, the primary service is provided by processing the obtained turbo stream.

The broadcasting service reception apparatus 300 illustrated in FIG. 3 may collect signaling information transmitted through remaining data regions of transmission frames by performing at least one of operations S520 through S540. After collecting the signaling information including configuration information of at least one broadcasting service, when a unit of the signaling information is completely collected, any other turbo streams as well as the turbo stream for the primary service may be accessed by using the collected signaling information.

The present invention can also be embodied as computer readable code to be recorded on a computer readable recording medium or to be transmitted through a transmission medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. The transmission medium can include carrier waves (e.g., transmission through the Internet).

According to the present invention, access information required to access a primary service is located in a predetermined region of a transmission frame and thus a broadcasting service reception apparatus may primarily provide the primary service by using the access information of the primary service without processing a SIC. Therefore, when the broadcasting service reception apparatus provides a broadcasting service, waiting time for providing the broadcasting service which is generated by searching for signaling information in the transmission frame, analyzing the signaling information, and accessing the broadcasting service may be reduced.

Furthermore, according to the present invention, the signaling information and data for the primary service are included in a remaining data region of the transmission frame and then are transmitted so that broadcasting channels may not be unnecessarily wasted and may be efficiently used, in comparison with a case when the signaling information and the primary service are allocated to channels having predetermined sizes and then are transmitted.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A method of transmitting a broadcasting service, the method comprising:
   packetizing data for at least one broadcasting service in accordance with a type of the data;
   generating at least one turbo stream by using the packetized data;
   generating at least one transmission frame having a predetermined size by using the at least one turbo stream; and
   transmitting the at least one transmission frame, and
   wherein the at least one turbo stream includes a first turbo stream for a primary service to be processed by a broadcasting service reception apparatus and provided to a user as a default service without channel search of the user and a second turbo stream for a normal service to be provided to a user as channel search of the user,
   wherein first access information required to access the first turbo stream for the primary service and second access information required to access signaling information are included in a given region of the at least one transmission frame, and
   wherein the signaling information includes third access information required to access the second turbo stream.

2. The method of claim 1, wherein the at least one transmission frame is an Advanced Television Systems Committee (ATSC) frame, and the access information required to access the first turbo stream for the primary service is included in a data field sync (DFS) segment.

3. The method of claim 1, wherein the access information includes decoding information required to decode the first turbo stream for the primary service.

4. The method of claim 1, wherein the first turbo stream for the primary service is transmitted through at least one data region of the at least one transmission frame which, after the at least one turbo stream is mapped to the at least one transmission frame, is not occupied by the at least one turbo stream.

5. The method of claim 4, wherein the data includes signaling information, and
   wherein the signaling information is transmitted through the at least one data region which, after the at least one turbo stream is mapped to the at least one transmission frame, is not occupied by the at least one turbo stream.

6. The method of claim 4, wherein the at least one transmission frame includes information indicating whether the signaling information or the first turbo stream for the primary service is transmitted through the at least one data region.

7. An apparatus for transmitting a broadcasting service, the apparatus comprising:
   a packet generation unit that packetizes data for at least one broadcasting service in accordance with a type of the data;
   a turbo stream generation unit that generates at least one turbo stream by using the packetized data;
   a transmission frame generation unit that generates at least one transmission frame having a predetermined size by using the at least one turbo stream; and
   a transmission unit that transmits the at least one transmission frame,
   wherein the at least one turbo stream includes a first turbo stream for a primary service to be processed by a broadcasting service reception apparatus and provided to a user as a default service without channel search of the user and a second turbo stream for a normal service to be provided to a user as channel search of the user,
   wherein first access information required to access the first turbo stream for the primary service and second access information required to access signaling information are included in a given region of the at least one transmission frame, and
   wherein the signaling information includes a third access information required to access the second turbo stream.

8. The apparatus of claim 7, wherein the at least one transmission frame is an Advanced Television Systems Committee (ATSC) frame, and the access information required to access the first turbo stream for the primary service is included in a data field sync (DFS) segment.

9. The apparatus of claim 7, wherein the access information includes decoding information required to decode the first turbo stream for the primary service.

10. The apparatus of claim 7, wherein the first turbo stream for the primary service is transmitted through at least one data region of the at least one transmission frame which, after the at least one turbo stream is mapped to the at least one transmission frame, is not occupied by the at least one turbo stream.

11. The apparatus of claim 7, wherein the data includes signaling information, and
    wherein the signaling information is transmitted through the at least one data region which, after the at least one turbo stream is mapped to the at least one transmission frame, is not occupied by the at least one turbo stream.

12. The apparatus of claim 7, wherein the at least one transmission frame includes information indicating whether the signaling information or the first turbo stream for the primary service is transmitted through the at least one data region.

13. A method of receiving a broadcasting service, the method comprising:
    receiving at least one transmission frame;
    analyzing, from a given region of the at least one transmission frame, first access information required to access a first turbo stream for a primary service to be processed by a broadcasting service reception apparatus and provided to a user as a default service without channel search of the user and second access information required to access signaling information which includes third access information required to access a second turbo stream for a normal service to be provided to the user as channel search of the user;
    accessing the first turbo stream for the primary service by using the analyzed first access information; and
    processing the first turbo stream.

14. The method of claim 13, wherein the at least one transmission frames is an Advanced Television Systems Committee (ATSC) frame, the access information required to access the first turbo stream for the primary service is included in a data field sync (DFS) segment.

15. The method of claim 13, wherein the access information includes decoding information required to decode the first turbo stream for the primary service.

16. The method of claim 13, wherein the turbo stream for the primary service is obtained through at least one data region of the at least one transmission frame which, after at least one turbo stream is mapped to the at least one transmission frame, is not occupied by the at least one turbo stream.

17. The method of claim 13, further comprising:
collecting signaling information transmitted through at least one data region of the at least one transmission frame which, after at least one turbo stream is mapped to the at least one transmission frame, is not occupied by the at least one turbo stream; and
accessing the at least one turbo stream by using the signaling information,
wherein the signaling information including configuration information of at least one broadcasting service is received through the at least one transmission frame.

18. The method of claim 13, wherein the signaling information or the first turbo stream for the primary service is accessed by using information indicating whether the signaling information or the first turbo stream for the primary service which is obtained from the at least one data region or not.

19. An apparatus for receiving a broadcasting service, the apparatus comprising:
a reception unit that receives at least one transmission frame;
a transmission frame processing unit that analyzes, from a given region of the at least one of the transmission frame, first access information required to access a first turbo stream for a primary service to be processed by a broadcasting service reception apparatus and provided to a user as a default service without channel search of the user second access information required to access signaling information which includes third access information required to access a second turbo stream for a normal service to be provided to the user as channel search of the user, and accesses the first turbo stream for the primary service by using the analyzed first access information; and
a turbo stream processing unit that processes the first turbo stream.

20. The apparatus of claim 19, wherein the at least one transmission frame is an Advanced Television Systems Committee (ATSC) frame, and the access information required to access the first turbo stream for the primary service is included in a data field sync (DFS) segment.

21. The apparatus of claim 19, wherein the access information includes decoding information required to decode the first turbo stream for the primary service.

22. The apparatus of claim 19, wherein the turbo stream for the primary service is obtained through at least one data region of the at least one transmission frame which, after at least one turbo stream is mapped to the at least one transmission frame, is not occupied by the at least one turbo stream.

23. The apparatus of claim 19, wherein the transmission frame processing unit collects signaling information transmitted through at least one data region of the at least one transmission frame which, after at least one turbo stream is mapped to the at least one transmission frame, is not occupied by the at least one turbo stream, and accesses the at least one turbo stream by using the signaling information, and
wherein the signaling information including configuration information of at least one broadcasting service is received through the at least one transmission frame.

24. The apparatus of claim 19, wherein the transmission frame processing unit accesses the signaling information or the first turbo stream for the primary service by using information indicating whether the signaling information or the turbo stream for the primary service which is obtained from the at least one data region or not.

25. A non-transitory computer readable recording medium having recorded thereon a computer program for executing a method of transmitting a broadcasting service, the method comprising:
packetizing data for at least one broadcasting service in accordance with a type of the data;
generating at least one turbo stream by using the packetized data;
generating at least one transmission frame having a predetermined size by using the at least one turbo stream; and
transmitting the at least one transmission frame,
wherein the at least one turbo stream includes a first turbo stream for a primary service to be processed by a broadcasting service reception apparatus and provided to a user as a default service without channel search of the user and a second turbo stream for a normal service to be provided to a user as channel search of the user,
wherein first access information required to access the first turbo stream for the primary service and second access information required to access signaling information are included in a given region of the at least one transmission frame, and
wherein the signaling information includes a third access information required to access the second turbo stream.

26. A non-transitory computer readable recording medium having recorded thereon a computer program for executing a method of receiving a broadcasting service, the method comprising:
receiving at least one transmission frame;
analyzing, from a given region of the at least one transmission frame, first access information required to access a first turbo stream for a primary service to be processed by a broadcasting service reception apparatus and provided to a user as a default service without channel search of the user and second access information required to access signaling information which includes third access information required to access a second turbo stream for a normal service to be provided to the user as channel search of the user;
accessing the first turbo stream for the primary service by using the analyzed first access information; and
processing the first turbo stream.

* * * * *